United States Patent
Hsu et al.

(10) Patent No.: US 10,916,416 B2
(45) Date of Patent: Feb. 9, 2021

(54) SEMICONDUCTOR WAFER WITH MODIFIED SURFACE AND FABRICATION METHOD THEREOF

(71) Applicant: TAIWAN SEMICONDUCTOR MANUFACTURING CO., LTD., Hsinchu (TW)

(72) Inventors: Yao-Wen Hsu, New Taipei (TW); Ching-Hung Kao, Tainan (TW); Po-Jen Wang, Taichung (TW); Tsung-Han Tsai, Miaoli County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/171,950

(22) Filed: Oct. 26, 2018

(65) Prior Publication Data

US 2019/0148127 A1 May 16, 2019

Related U.S. Application Data

(60) Provisional application No. 62/586,032, filed on Nov. 14, 2017.

(51) Int. Cl.
| | |
|---|---|
| *H01L 21/02* | (2006.01) |
| *H01L 21/683* | (2006.01) |
| *H01L 21/687* | (2006.01) |
| *H01L 21/67* | (2006.01) |

(Continued)

(52) U.S. Cl.
CPC .. *H01L 21/02016* (2013.01); *H01L 21/02002* (2013.01); *H01L 21/22* (2013.01); *H01L 21/67103* (2013.01); *H01L 21/6831* (2013.01); *H01L 21/68757* (2013.01); *H01L 21/68764* (2013.01); *H01L 21/68785* (2013.01); *H01J 2237/31701* (2013.01); *H01L 27/1203* (2013.01)

(58) Field of Classification Search
None
See application file for complete search history.

(56) References Cited

U.S. PATENT DOCUMENTS

| | | | |
|---|---|---|---|
| 8,859,393 B2 * | 10/2014 | Ries | H01L 21/76254 438/458 |
| 2011/0024049 A1 * | 2/2011 | Stevenson | H01J 37/3255 156/345.53 |
| 2016/0336214 A1 * | 11/2016 | Petzold | H01L 21/84 |

(Continued)

*Primary Examiner* — Bilkis Jahan
(74) *Attorney, Agent, or Firm* — Maschoff Brennan

(57) ABSTRACT

A semiconductor wafer and a semiconductor wafer fabrication method are provided. The wafer includes a supporting substrate, a semiconductor substrate and a contact layer. The supporting substrate has a first surface and a second surface opposite to the first surface. The semiconductor substrate is disposed on the first surface of the supporting substrate, in which the semiconductor substrate is configured to form plural devices. The contact layer is disposed on the second surface of the supporting substrate to contact the supporting substrate, in which the contact layer is configured to contact an electrostatic chuck and has a resistivity of the contact layer smaller than a resistivity of the supporting substrate. In semiconductor wafer fabrication method, at first, a raw wafer is provided. Then, the contact layer is formed by using an implantation operation or a deposition operation.

20 Claims, 20 Drawing Sheets

(51) Int. Cl.
*H01L 21/22* (2006.01)
*H01L 27/12* (2006.01)

(56) References Cited

U.S. PATENT DOCUMENTS

2017/0372946 A1\* 12/2017 Peidous ............ H01L 21/02595
2018/0330983 A1\* 11/2018 Wang ................ H01L 21/02581

\* cited by examiner

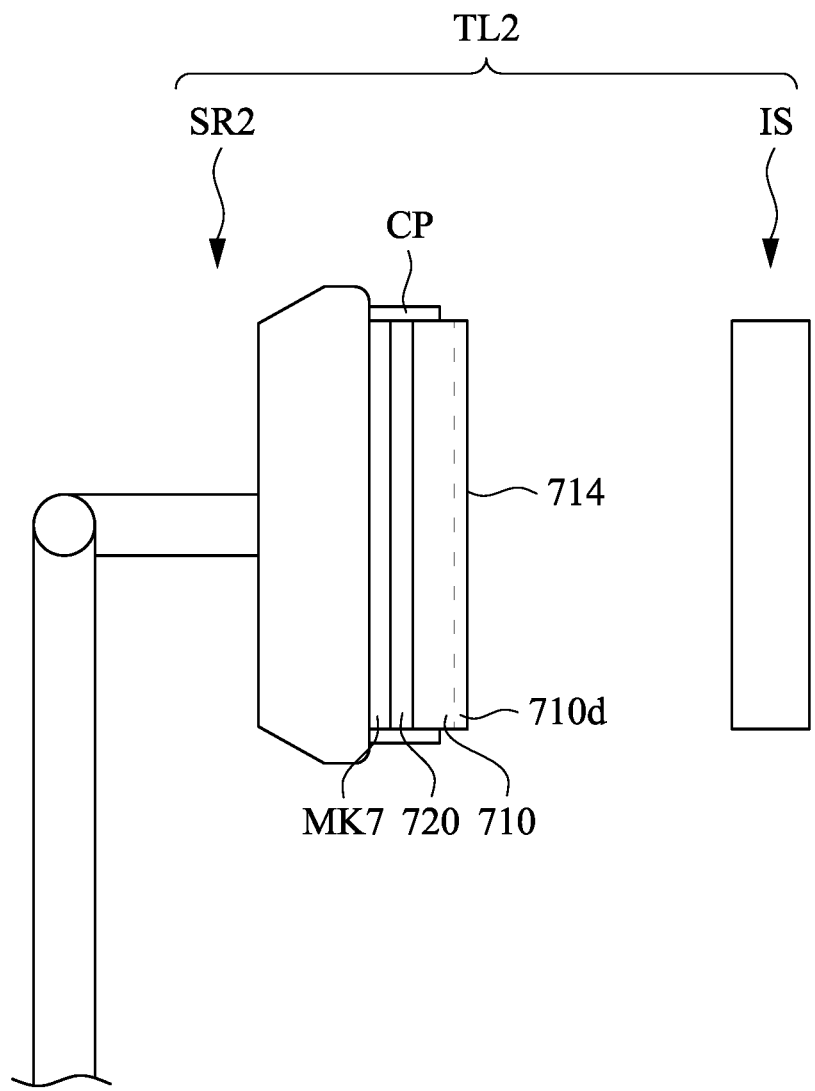
Fig. 7d(1)

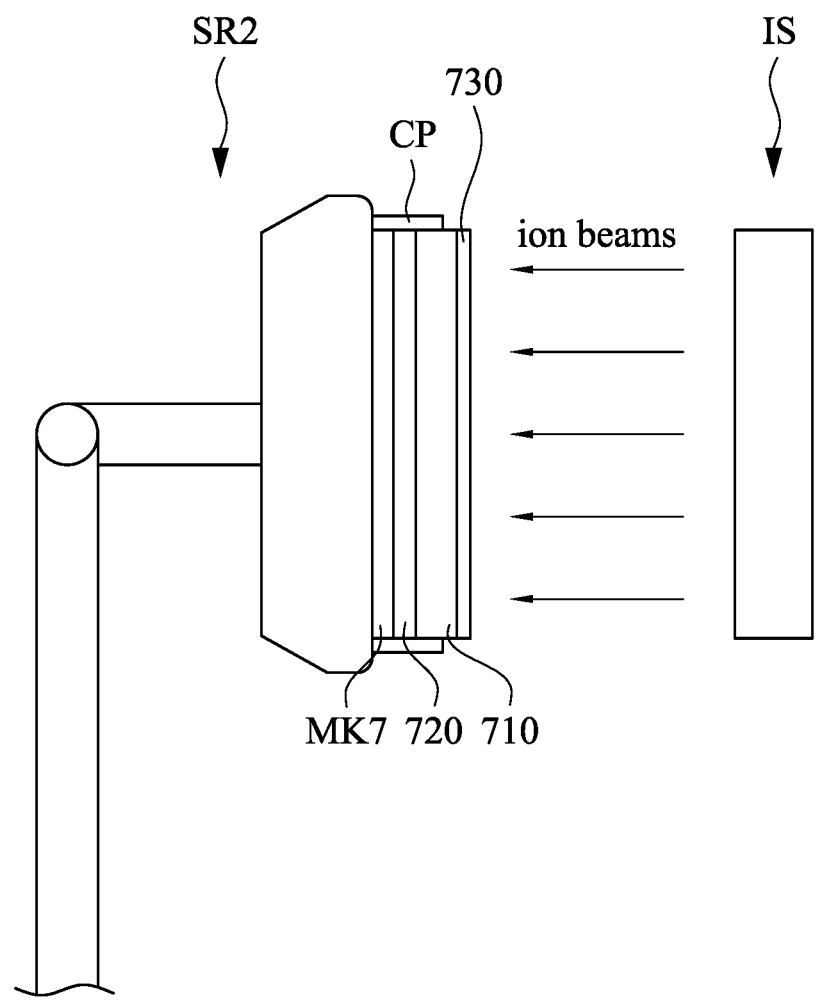
Fig. 7d(2)

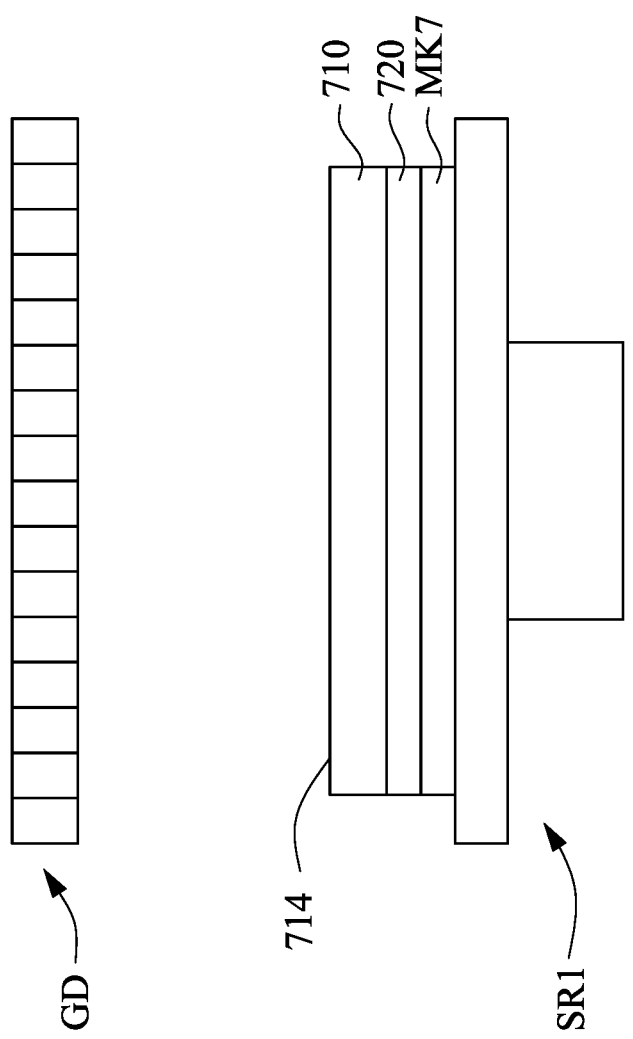

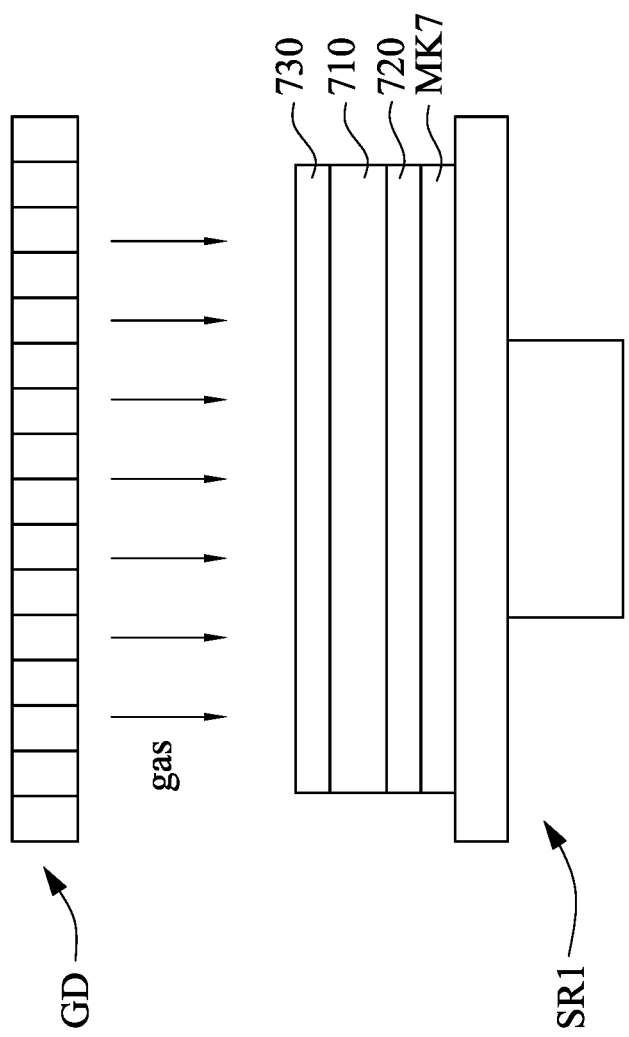

US 10,916,416 B2

SEMICONDUCTOR WAFER WITH MODIFIED SURFACE AND FABRICATION METHOD THEREOF

RELATED APPLICATION

This application claims the benefit of the Provisional Application Ser. No. 62/586,032, filed Nov. 14, 2017. The entire disclosures of all the above applications are hereby incorporated by reference herein.

BACKGROUND

In the processing of a semiconductor wafer, the semiconductor wafer is generally disposed on a wafer support in a process chamber. The wafer support includes an electrostatic chuck having electrodes capable of being electrically biased to secure the wafer on the wafer support. For example, high frequency electric power may be applied to the electrodes to enable positive and negative charges to be respectively produced in the semiconductor wafer and a chuck surface of the electrostatic chuck, such that the semiconductor wafer is attracted and held on the chuck surface by the coulomb force between the semiconductor wafer and the electrodes. The wafer support may also include a support post and a pedestal that supports the electrostatic chuck in the process chamber, and may be capable of raising or lowering the height of the chuck and the semiconductor wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7a to FIG. 7f are schematic diagrams of intermediate stages showing a semiconductor wafer fabrication method in accordance with some embodiments of the present disclosure.

DETAILED DESCRIPTION

Figure 1A:
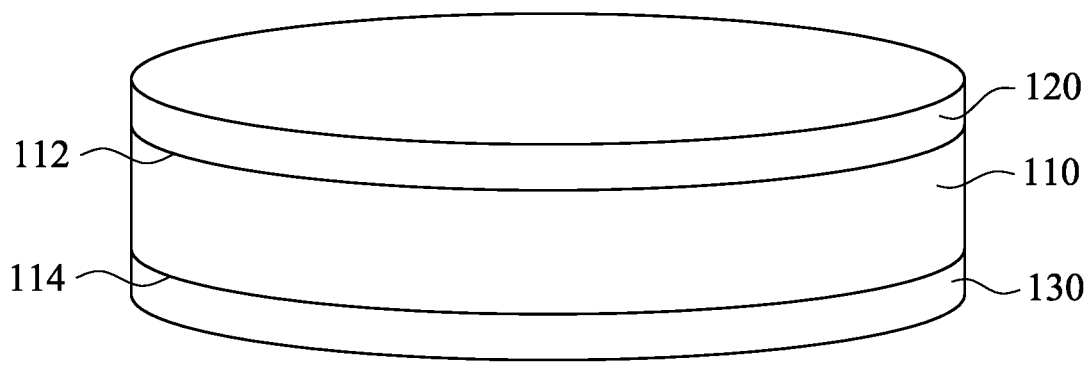
FIG. 1a is a schematic diagram showing a semiconductor wafer in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Embodiments of the present disclosure are directed to a semiconductor wafer to be processed on an electrostatic chuck, and a semiconductor wafer fabrication method. The semiconductor wafer employs a contact layer disposed on a supporting substrate to contact the electrostatic chuck, in which the contact layer has a resistivity smaller than a resistivity of the supporting substrate. When the electrostatic chuck is turned on to secure the semiconductor wafer, a greater current between electrodes of the electrostatic chuck is generated because the contact layer has a smaller resistivity. The greater current induced in the contact layer enables the semiconductor wafer to be secured firmly on the electrostatic chuck when the semiconductor wafer is being processed. In the semiconductor wafer fabrication method, the contact layer may be formed by using a deposition operation or an implantation operation.

Referring to FIG. 1a, FIG. 1a is a schematic diagram showing a semiconductor wafer 100 in accordance with some embodiments of the present disclosure. The semiconductor wafer 100 includes a supporting substrate 110, a semiconductor substrate 120 and a contact layer 130. The supporting substrate 110 is used to support the semiconductor substrate 120. In some embodiments, the supporting substrate 110 includes a high resistivity silicon material with a resistivity greater than about 3000 ohm-cm. However, embodiments of the present disclosure are not limited thereto. In some embodiments, the resistivity of the supporting substrate 110 is in a range from about 3000 ohm-cm to about 8000 ohm-cm. The supporting substrate 110 has a first surface 112 and a second surface 114 opposite to the first surface 112, and the semiconductor substrate 120 is disposed on the first surface 112 of the supporting substrate 110. The semiconductor substrate 120 is configured to form plural devices. In some embodiments, the semiconductor substrate 120 is an active silicon layer and may be processed to form transistors of RF (radio frequency) devices on the semiconductor substrate 120. When the supporting substrate 110 is provided with the above resistivity condition, the supporting substrate 110 can improve performance of radio-frequency (RF) devices formed above the supporting substrate 110. Otherwise, the performance of the RF devices is not improved significantly.

The contact layer 130 is disposed on the second surface 114 of the supporting substrate 110. The contact layer 130 is an outmost layer of the semiconductor wafer 100, and is configured to contact an electrostatic chuck while the semiconductor wafer 100 is being processed. To enable the semiconductor wafer 100 to be held firmly on the electrostatic chuck, the contact layer 130 is formed to have a resistivity smaller than the resistivity of the supporting substrate 110.

Figure 2A:
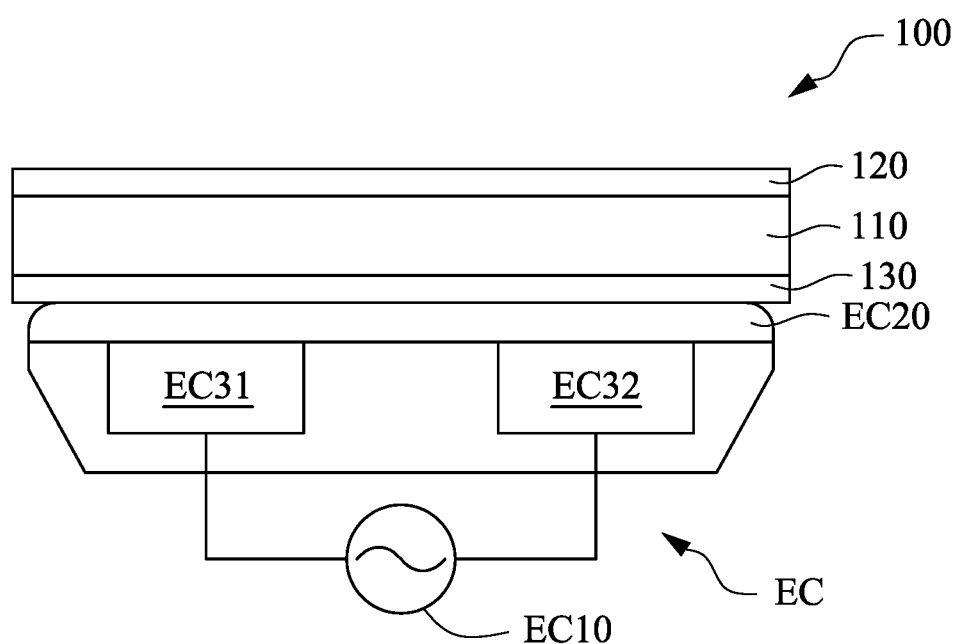
FIG. 2a is a schematic diagram showing a structure of an electrostatic chuck in accordance with some embodiments of the present disclosure.
Figure 2B:
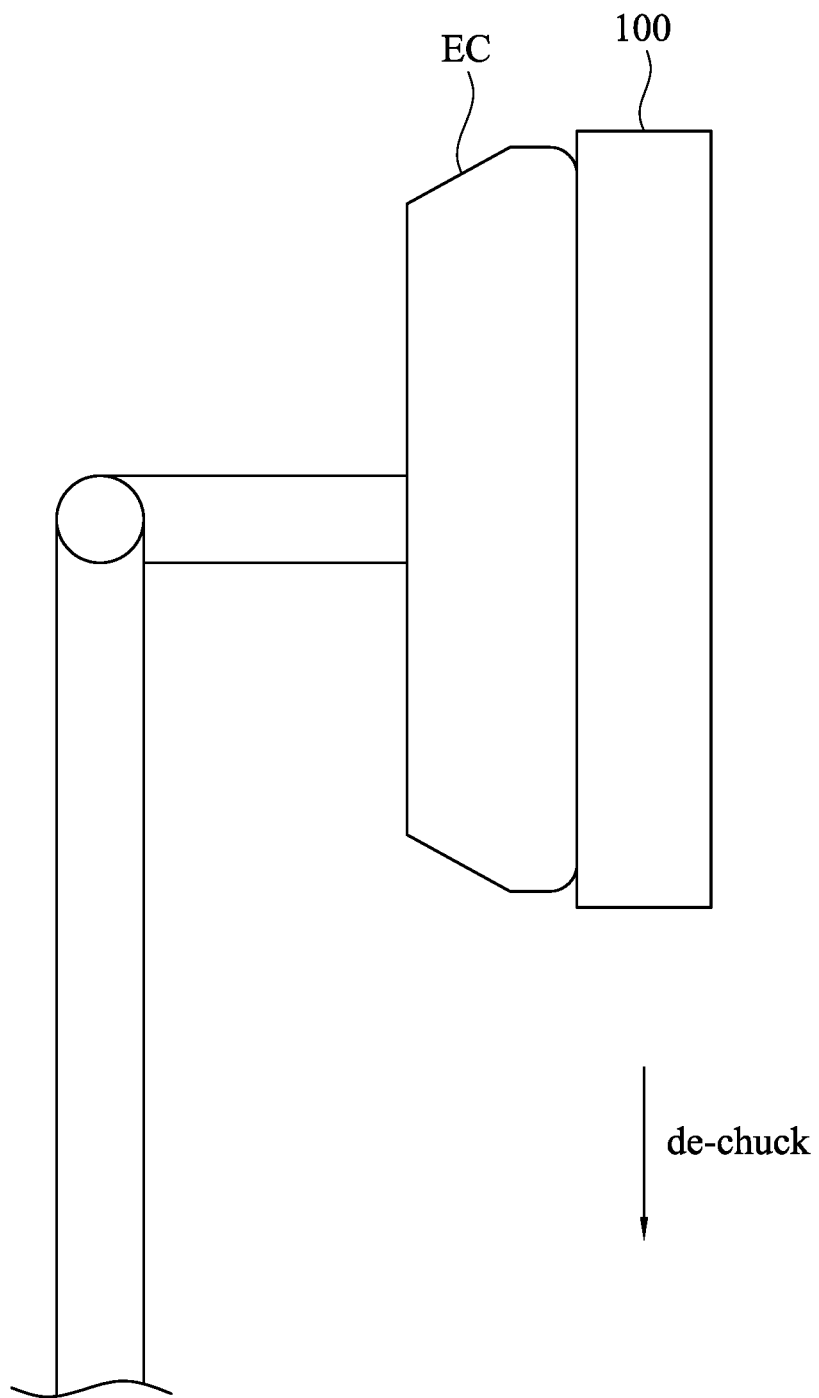
FIG. 2b is a schematic diagram showing the electrostatic chuck securing the semiconductor wafer in accordance with some embodiments of the present disclosure.

Referring to FIG. 2a and FIG. 2b simultaneously, FIG. 2a is a schematic diagram showing a structure of an electrostatic chuck EC in accordance with some embodiments of the present disclosure, and FIG. 2b is a schematic diagram showing the electrostatic chuck EC securing the semiconductor wafer 100 in accordance with some embodiments of the present disclosure. The electrostatic chuck EC includes a power source EC10, a dielectric layer EC20 and electrodes EC31 and EC32. The semiconductor wafer 100 is disposed on the dielectric layer EC20 of the electrostatic chuck EC, in which the contact layer 130 contacts the dielectric layer EC20, as shown in FIG. 2a. When the electrostatic chuck EC is turned on to secure the semiconductor wafer 100, the power source EC10 provides electric power to the electrodes EC31 and EC32 to generate a voltage difference between the electrodes EC31 and EC32 to generate a current between the electrodes EC31 and EC32. Therefore, when the electrostatic chuck EC is vertically arranged, the semiconductor wafer 100 is secured on the electrostatic chuck EC by a coulomb force, as shown in FIG. 2b. In some embodiments, the voltage difference between the electrodes EC31 and EC32 is from about 800 volts to about 2200 volts. When the voltage difference is lower than 1800 volts, the electrostatic chuck EC cannot secure the semiconductor wafer firmly. When the voltage difference is greater than about 2200 volts, the semiconductor wafer may be damaged due to the greater electrostatic attraction force.

In some embodiments, the supporting substrate 110 includes a high resistivity silicon material with a resistivity greater than about 3000 ohm-cm, and thus the supporting substrate 110 alone may not be firmly held on the electrostatic chuck EC due to the high resistivity silicon material causing a small current between electrodes of the electrostatic chuck EC. To prevent the semiconductor wafer 100 from being de-chucked from the electrostatic chuck EC unintentionally, the contact layer 130 is designed to have a resistivity smaller than or equal to about 3000 ohm-cm so as to generate a greater current generated between the electrodes EC31 and EC32 of the electrostatic chuck EC, thereby enabling the electrostatic chuck EC to provide a sufficient force to secure the semiconductor wafer 100 firmly. However, if the resistivity of the contact layer 130 is too small, for example, not greater about 50 ohm-cm, too high current is generated and damages the electrostatic chuck EC. In some embodiments, the contact layer 130 is designed to have a resistivity about smaller than about 3000 ohm-cm and greater than about 50 ohm-cm. In some embodiments, the contact layer 130 is designed to have a resistivity of 300 ohm-cm.

Further, in some embodiments, the contact layer 130 may be formed by an implantation operation. The implantation operation is conducted to dope the supporting substrate 110 with a dopant, in which the dopant may be a group III element or a group V element. In some embodiments, the supporting substrate 110 is doped at a concentration from about $1\times10^{12}$ atoms/cm$^2$ to about $1\times10^{18}$ atoms/cm$^2$. When the concentration of the dopant is lower than about $1\times10^{12}$ atoms/cm$^2$, the backside of the supporting substrate may not have the expected resistivity which is smaller than or equal to about 3000 ohm-cm. When the concentration of the dopant is greater than $1\times10^{18}$ atoms/cm$^2$, the backside of the supporting substrate cannot have the expected resistivity which is greater than about 50 ohm-cm, so as to transform a portion of the supporting substrate as the contact layer 130. However, embodiments of the present disclosure are not limited thereto. In some embodiments, the contact layer 130 may be formed by depositing a material layer that has a resistivity smaller than the resistivity of the supporting substrate 110 on the second surface 114 of the supporting substrate 110.

Figure 1B:
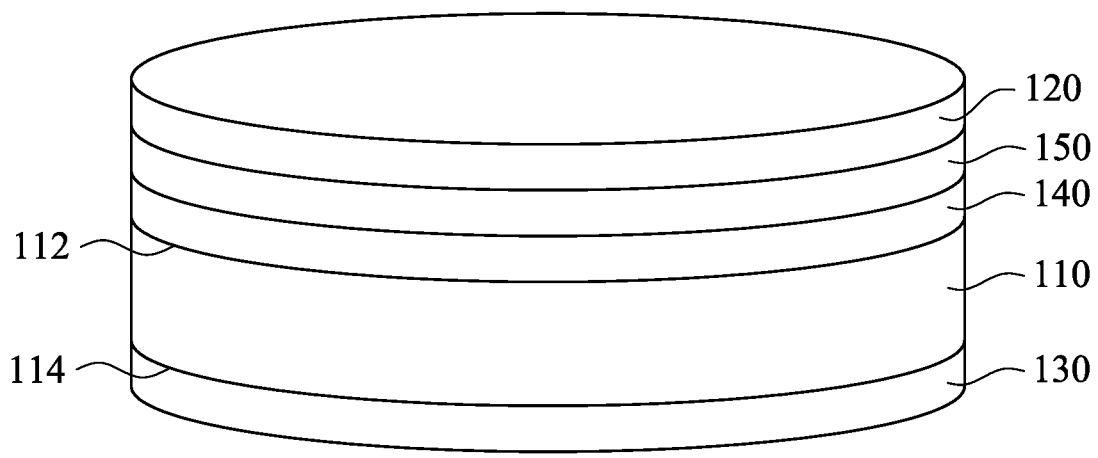
FIG. 1b is a schematic diagram showing a semiconductor wafer in accordance with some embodiments of the present disclosure.

In addition, in some embodiments, the semiconductor wafer 100 may be a silicon-on-insulator (SOI) wafer including a trap-rich layer 140 and a buried oxide layer 150, as shown in FIG. 1b. The trap-rich layer 140 and the buried oxide layer 150 are disposed between the supporting substrate 110 and the semiconductor substrate 120. In some embodiments, the trap-rich layer 140 is disposed between the buried oxide layer 150 and the semiconductor substrate 120, and the buried oxide layer 150 is disposed between the trap-rich layer 140 and the supporting substrate 110. In some embodiments, the trap-rich layer 140 is formed from amorphous silicon crystal or polycrystalline silicon crystal. In some embodiments, the buried oxide layer 150 is either grown or deposited overlying the trap-rich layer 140. Other oxide materials could be used for the buried oxide layer 150.

Figure 3A:
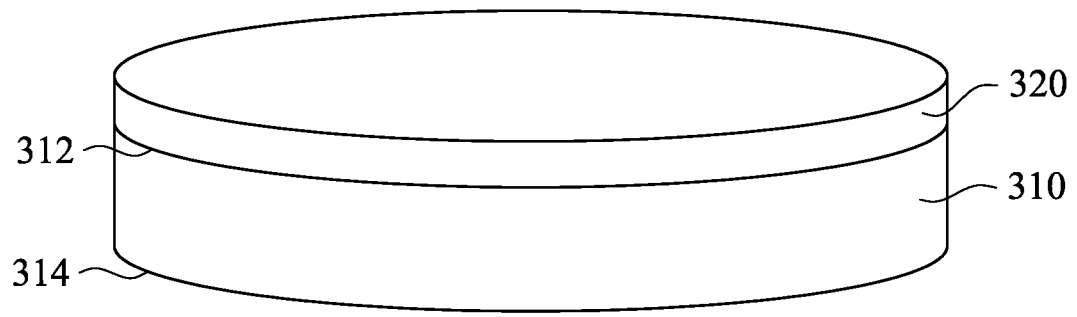
FIG. 3a to FIG. 3e are schematic diagrams of intermediate stages showing a semiconductor wafer fabrication method in accordance with some embodiments of the present disclosure.

Referring to FIG. 3a to FIG. 3e, FIG. 3a to FIG. 3e are schematic diagrams of intermediate stages showing a semiconductor wafer fabrication method in accordance with some embodiments of the present disclosure. A raw wafer 300 is provided, as shown in FIG. 3a. The raw wafer 300 includes a supporting substrate 310 and a semiconductor substrate 320 formed on the supporting substrate 310. The supporting substrate 310 is used to support the semiconductor substrate 320. In some embodiments, the supporting substrate 310 includes a high resistivity silicon material with a resistivity greater than about 3000 ohm-cm. In some embodiments, the resistivity of the supporting substrate 310 is greater than about 3000 ohm-cm and lower than or equal to about 8000 ohm-cm. When the supporting substrate 310 is provided with the above condition, the supporting substrate 310 can improve performance of radio-frequency (RF) devices formed above the supporting substrate 310. Otherwise, the performance of the RF devices is not improved significantly. As described above, the high resistivity silicon material causing a small current between electrodes of the electrostatic chuck, and is disadvantageous to holding the raw wafer 300 firmly on the electrostatic chuck.

The supporting substrate 310 has a first surface 312 and a second surface 314 opposite to the first surface 312, and the semiconductor substrate 320 is disposed on the first surface 312 of the supporting substrate 310. The semiconductor substrate 320 will be processed subsequently to form plural devices on the semiconductor substrate 320. In some embodiments, the semiconductor substrate 320 is an active silicon layer, and may be processed to form transistors of RF devices on the semiconductor substrate 320.

Figure 3B:
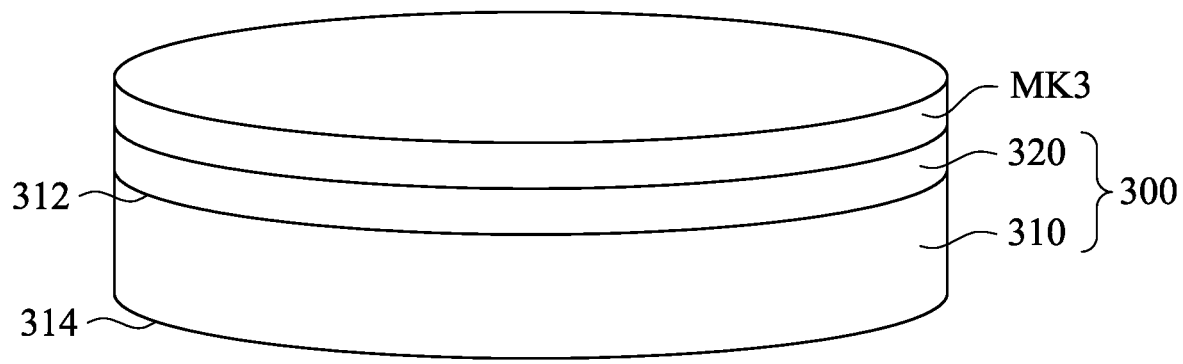

A mask layer MK3 is formed on the semiconductor substrate 320 to protect the semiconductor substrate 320, as shown in FIG. 3b. In some embodiments, the mask layer MK3 is formed from silicon nitride, but embodiments of the present disclosure are not limited thereto.

Figure 3C:
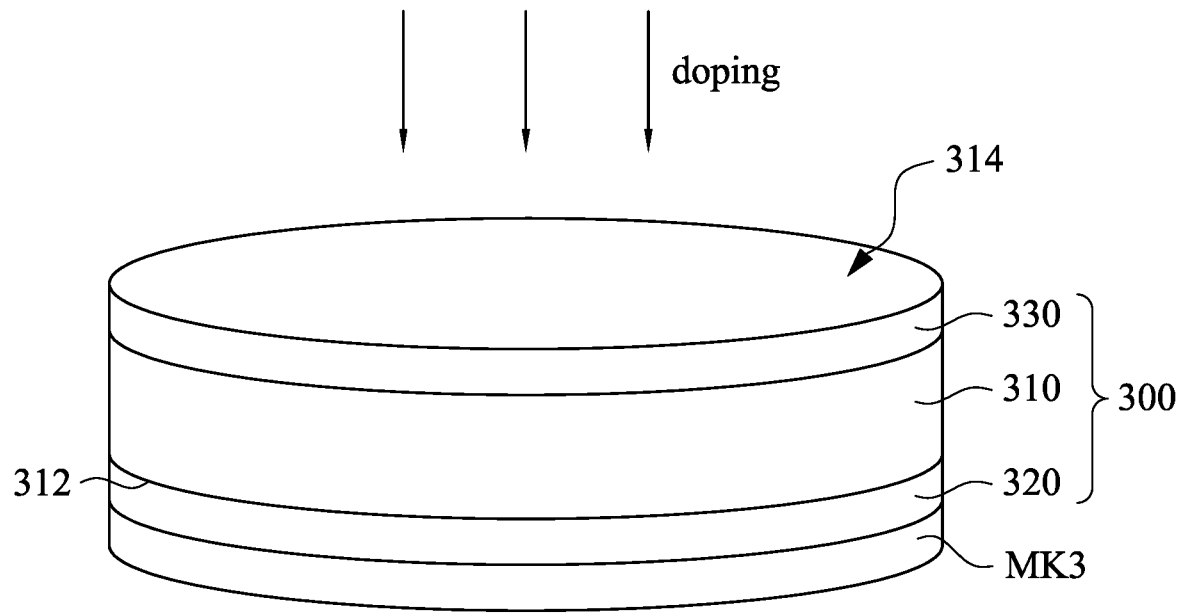

Thereafter, the raw wafer 300 is reversed, and the second surface 314 of the supporting substrate 310 is doped with a dopant by an implantation operation, so as to transform a portion of the supporting substrate 310 to a contact layer 330, as shown in FIG. 3c. In some embodiments, the second surface 314 of the supporting substrate 310 is doped with a group III element or a group V element at a concentration from about $1\times10^{12}$ atoms/cm$^2$ to about $1\times10^{18}$ atoms/cm$^2$. When the concentration of the dopant is lower than about $1\times10^{12}$ atoms/cm$^2$, the backside of the supporting substrate may not have the expected resistivity smaller than or equal to about 3000 ohm-cm. When the concentration of the dopant is greater than about $1\times10^{18}$ atoms/cm$^2$, the backside of the supporting substrate cannot have the expected resistivity greater than about 50 ohm-cm. However, embodiments of the present disclosure are not limited thereto.

Figure 3D:
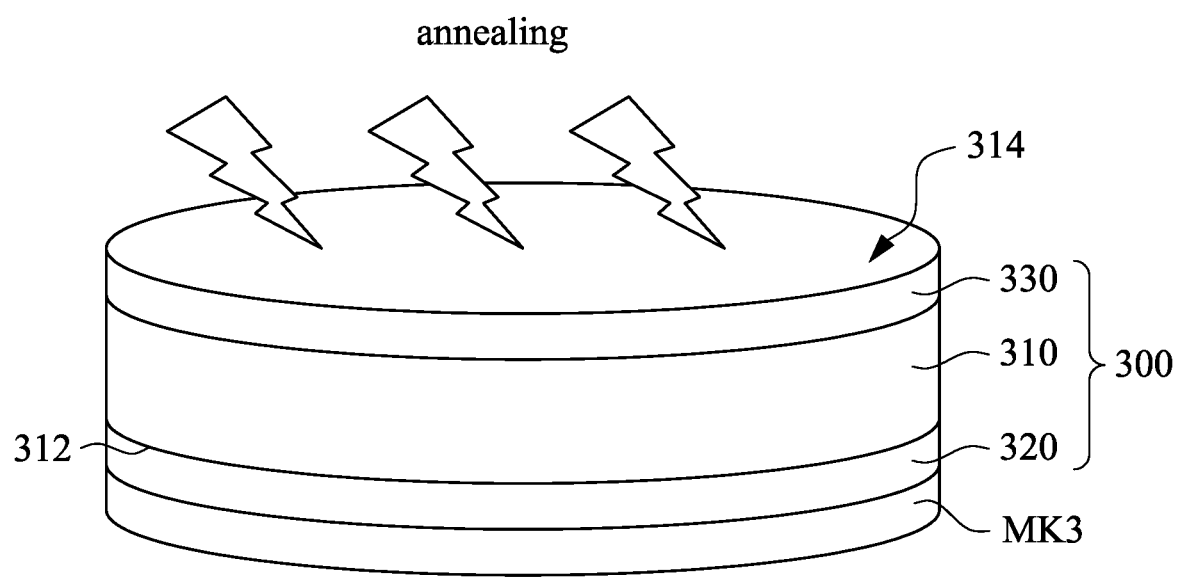

Then, as shown in FIG. 3d, an annealing operation is performed on the contact layer 330, thereby reducing defects on the contact layer 330 caused by the previous implantation operation. In some embodiments, a rapid thermal annealing (RTA) operation is used to anneal the contact layer 330, but embodiments of the present disclosure are not limited thereto. In some embodiments, the annealing operation is conducted at a temperature from about 800° C. to about 1150° C. for a period of time from about 10 sec to about 120 sec. However, embodiments of the present disclosure are not limited thereto. When the annealing operation is operated under the above condition, dangling bonds of the contact layer 330 are recovered. Otherwise, the dangling bonds of the contact layer 330 are not recovered significantly.

Figure 3E:
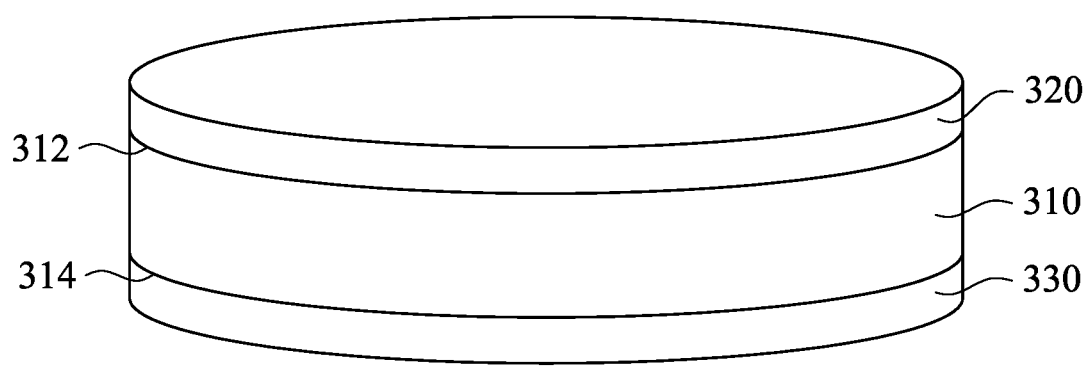
Figure 4:
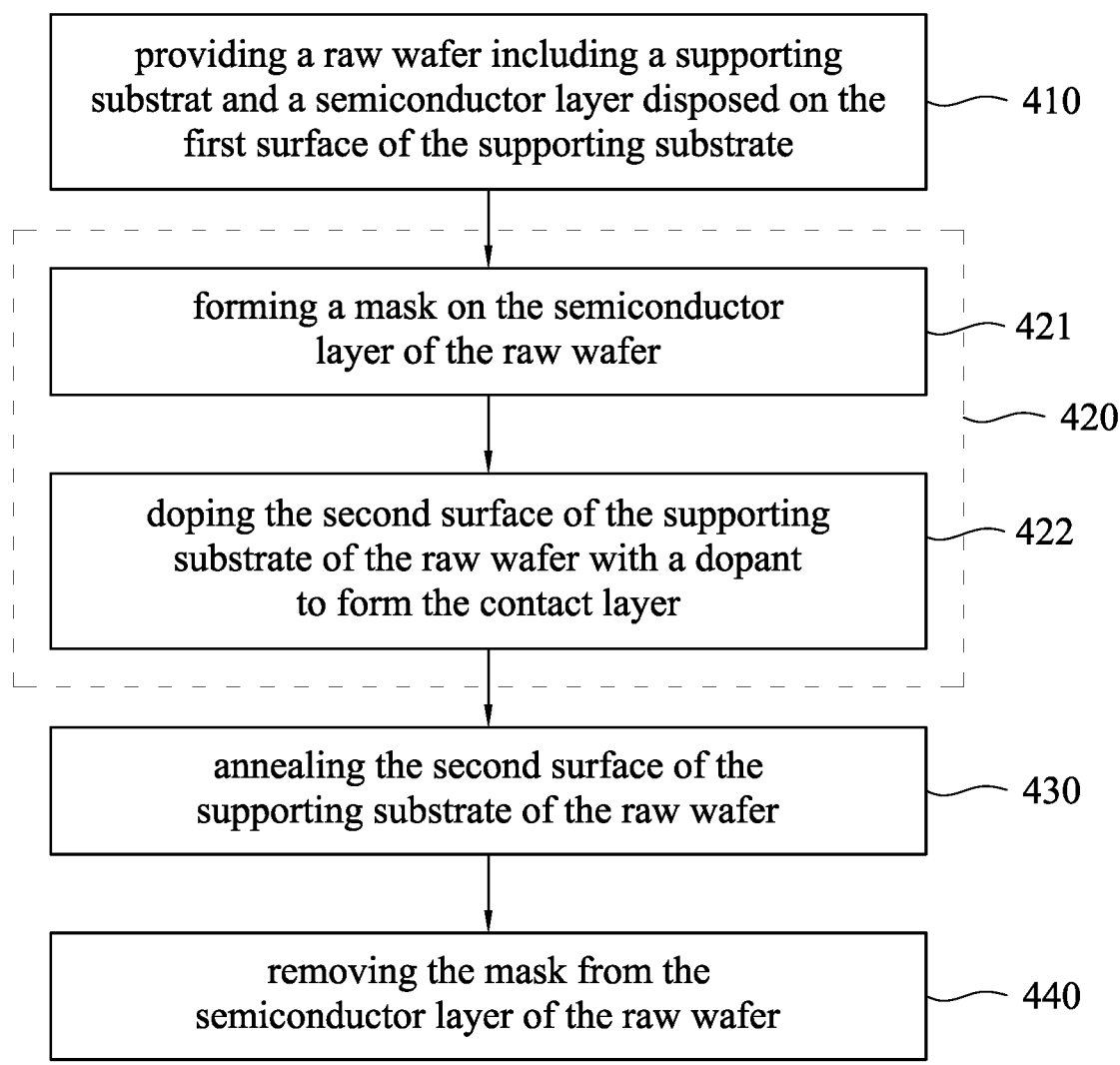
FIG. 4 is a flow chart showing a wafer fabrication method in accordance with embodiments of the present disclosure.

Thereafter, the raw wafer 300 is reversed and the mask MK3 is removed, and the raw wafer 300 becomes a modified wafer MW3, as shown in FIG. 3e.

Because the contact layer 330 is formed by doping a portion of the supporting substrate 310, the contact layer 330 has a resistivity smaller than the resistivity of the supporting substrate 310. When the modified wafer MW3 is disposed on the electrostatic chuck for being processed, the contact layer 330 contacts the electrostatic chuck and a greater current is generated between the electrodes of the electrostatic chuck when the voltage difference is applied, thereby providing a greater force due to the low resistivity of the contact layer 330, so as to prevent the modified wafer MW3 from being de-chucked from the electrostatic chuck unintentionally. In some embodiments, the contact layer 330 is formed to have a resistivity smaller than or equal to about 3000 ohm-cm and greater than about 50 ohm-cm. In some embodiments, the contact layer 330 is formed to have a resistivity smaller than about 3000 ohm-cm.

Referring to FIG. 3a to FIG. 3e and FIG. 4, FIG. 4 is a flow chart showing a semiconductor wafer fabrication method 400 in accordance with embodiments of the present disclosure. In the semiconductor wafer fabrication method 400, at operation 410, the raw wafer 300 including the supporting substrate 310 and the semiconductor substrate 320 formed on the second surface 314 of the supporting substrate 310 is provided, as shown in FIG. 3a. Then, at operation 420, an implantation operation is performed on the supporting substrate 310. In the implantation operation, at first, operation 421 is performed to form the mask MK3 on the semiconductor substrate 320 to protect the semiconductor substrate 320 from being implanted, as shown in FIG. 3b. Then, operation 422 is performed to dope the second surface 314 of the supporting substrate 310 with the dopant to form the contact layer 330, as shown in FIG. 3c.

Thereafter, as shown in FIG. 3d, at operation 430, an annealing operation is performed on the contact layer 330, thereby reducing defects on the contact layer 330. Then, at operation 440, the mask MK3 is removed to expose the semiconductor substrate 320, as shown in FIG. 3e.

Figure 5A:
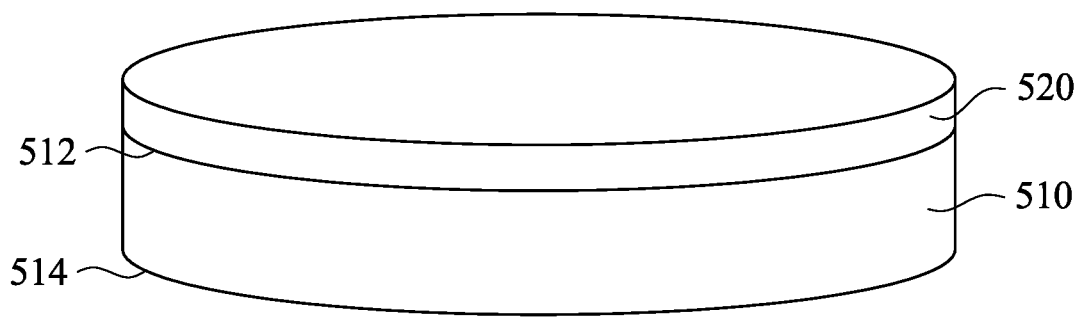
FIG. 5a to FIG. 5d are schematic diagrams of intermediate stages showing a semiconductor wafer fabrication method in accordance with some embodiments of the present disclosure.
Figure 5B:
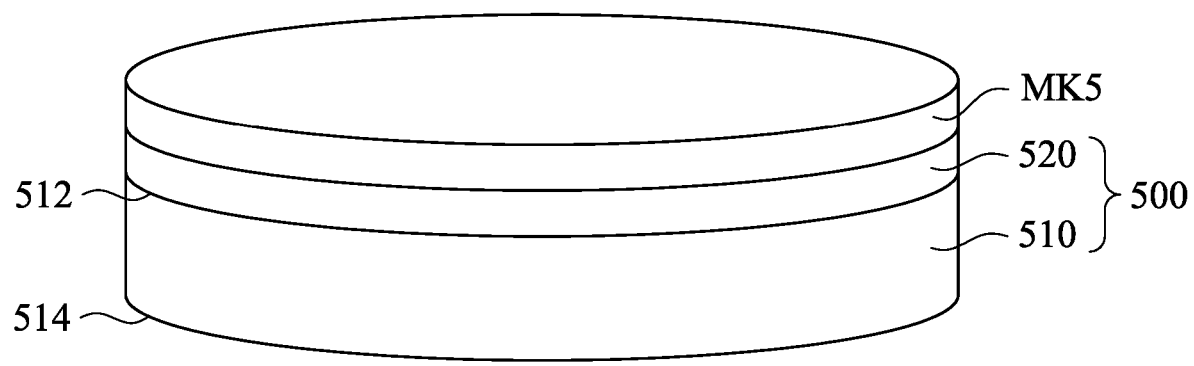
Figure 5C:
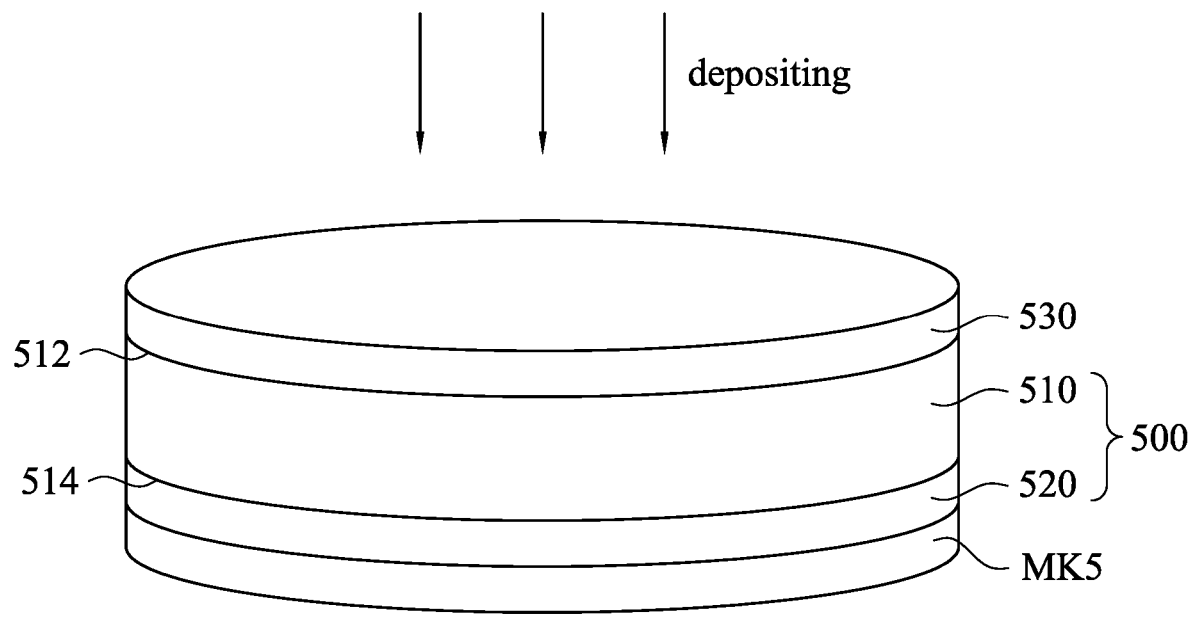
Figure 5D:
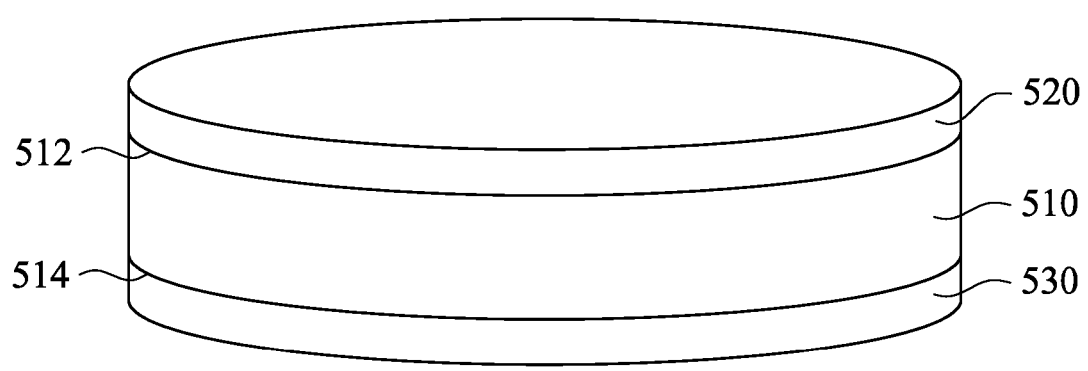
Figure 6:
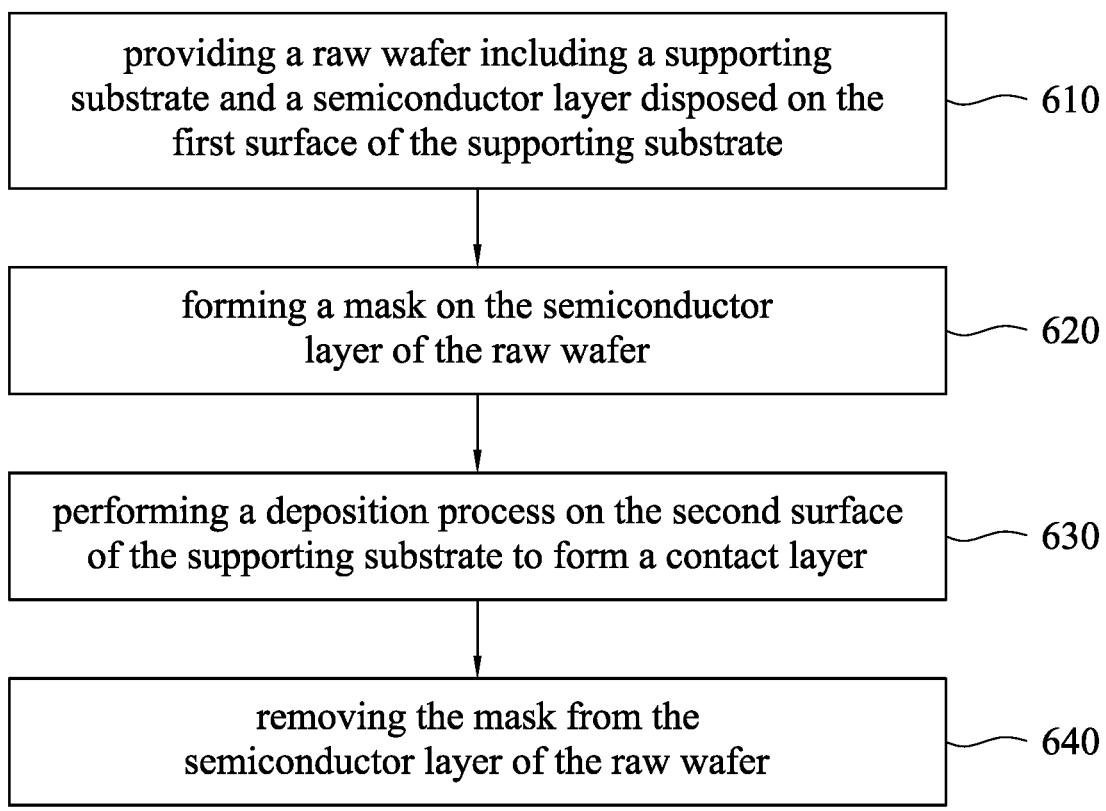
FIG. 6 is a flow chart showing a semiconductor wafer fabrication method in accordance with embodiments of the present disclosure.

Referring to FIG. 5a to FIG. 5d and FIG. 6, FIG. 5a to FIG. 5d are schematic diagrams of intermediate stages showing a semiconductor wafer fabrication method in accordance with some embodiments of the present disclosure; and FIG. 6 is a flow chart showing a semiconductor wafer fabrication method 600 in accordance with embodiments of the present disclosure. The embodiments shown in FIG. 5a to FIG. 5d and FIG. 6 are different from those shown in FIG. 3a to FIG. 3e and FIG. 4 in that the contact layer is formed by depositing instead of by implantation and annealing.

In the semiconductor wafer fabrication method 600, at first, operation 610 is performed to provide a raw wafer 500, as shown in FIG. 5a. The raw wafer 500 includes a supporting substrate 510 and a semiconductor substrate 520. The supporting substrate 510 is used to support the semiconductor substrate 520. The supporting substrate 510 is similar to the supporting substrate 310, and the semiconductor substrate 520 is similar to the semiconductor substrate 320. Therefore, detail properties of the supporting substrate 510 and the semiconductor substrate 520 are not described again herein.

Then, operation 620 is performed to form a mask layer MK5 on the semiconductor substrate 520 to protect the semiconductor substrate 520, as shown in FIG. 5b. In some embodiments, the mask layer MK5 is formed from silicon nitride, but embodiments of the present disclosure are not limited thereto.

Thereafter, the raw wafer 500 is reversed, and operation 630 is performed to form a contact layer 530 on the second surface 514 of the supporting substrate 510 by a depositing operation, as shown in FIG. 5c. In some embodiments, the deposition operation may be a thermal deposition operation, physical vapor deposition (PVD) operation or a chemical vapor deposition (CVD) operation. In some embodiments, the contact layer 530 is a silicon nitride layer (for example, $Si_3N_4$) formed by using the thermal deposition operation at a temperature from about 400° C. to about 800° C. When the thermal deposition is performed under the above condition, the thickness of the contact layer can be effectively controlled. Otherwise, an unexpected contact layer having a large thickness or a small thickness is formed. In some embodiments, the contact layer 530 can be a silicon nitride layer formed by using the chemical vapor deposition operation at a temperature from about 500° C. to about 650° C. However, embodiments of the present disclosure are not limited thereto. When the chemical vapor deposition operation is performed under the above condition, the thickness of the contact layer can be effectively controlled. Otherwise, an unexpected contact layer having a large thickness or a small thickness is formed.

Then, the raw wafer 500 is reversed and operation 640 is performed to remove the mask MK5, and thus the raw wafer 500 becomes a modified wafer MW5, as shown in FIG. 5d.

The contact layer 530 is formed from a material having a resistivity smaller than the resistivity of the supporting substrate 510. Therefore, when the modified wafer MW5 is disposed on the electrostatic chuck EC for being processed, the contact layer 530 contacts the electrostatic chuck EC and a greater current is generated between the electrodes of the electrostatic chuck due to the low resistivity of the contact layer 530, thereby providing a greater force, so as to prevent the modified wafer MW5 from being de-chucked from the electrostatic chuck unintentionally. In some embodiments, the contact layer 530 is formed to have a resistivity smaller than or equal to about 3000 ohm-cm and greater than about 50 ohm-cm. In some embodiments, the contact layer 530 is formed to have a resistivity smaller than about 3000 ohm-cm.

Referring to FIG. 6, FIG. 6 is a flow chart showing a semiconductor wafer fabrication method 600 in accordance with embodiments of the present disclosure. At operation 610, the raw wafer 500 is provided, as shown in FIG. 5a. Then, at operation 620, the mask MK5 is formed on the semiconductor substrate 520 to protect the semiconductor substrate 520, as shown in FIG. 5b. Thereafter, at operation 630, a deposition operation is performed to form the contact layer 530 on the second surface 514 of the supporting substrate 510, as shown in FIG. 5c. Then, at operation 640, the mask MK5 is removed to expose the semiconductor substrate 520, as shown in FIG. 5d.

Figure 7A:
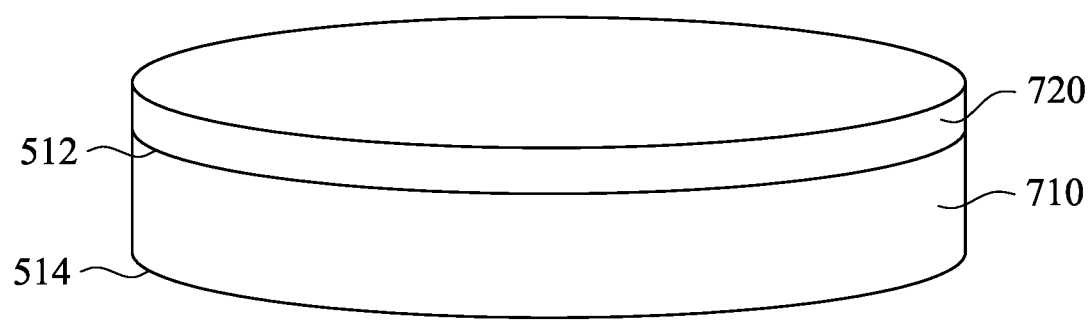

Referring to FIG. 7a to FIG. 7f, FIG. 7a to FIG. 7f are schematic diagrams of intermediate stages showing a semiconductor wafer fabrication method in accordance with some embodiments of the present disclosure. A raw wafer 700 is provided, as shown in FIG. 7a. The raw wafer 700 includes a supporting substrate 710 and a semiconductor substrate 720 formed on the supporting substrate 710. The supporting substrate 710 is used to support the semiconductor substrate 720. In some embodiments, the semiconductor substrate 720 is an active silicon layer and may be processed to form transistors of RF (radio frequency) devices on the semiconductor substrate 720, but embodiments of the present disclosure are not limited thereto.

In some embodiments, the supporting substrate 710 includes a high resistivity silicon material with a resistivity greater than about 3000 ohm-cm. In some embodiments, the resistivity of the supporting substrate 710 is about 8000 ohm-cm. As described above, the high resistivity silicon material causing a small current between electrodes of the electrostatic chuck, and is disadvantageous to holding the raw wafer 700 firmly on the electrostatic chuck.

The supporting substrate 710 has a first surface 712 and a second surface 714 opposite to the first surface 712, and the semiconductor substrate 720 is disposed on the first surface 712 of the supporting substrate 710. The semiconductor substrate 720 will be processed subsequently to form plural devices on the semiconductor substrate 720. In some embodiments, the semiconductor substrate 720 is an active silicon layer, and may be processed to form transistors of RF devices on the semiconductor substrate 720.

In some embodiments, the semiconductor wafer 700 may be a silicon-on-insulator (SOI) wafer including a trap-rich layer and a buried oxide layer (not shown). The trap-rich layer and the buried oxide layer are disposed between the supporting substrate 710 and the semiconductor substrate 720. In some embodiments, the trap-rich layer is disposed between the buried oxide layer and the semiconductor substrate 720, and the buried oxide layer is disposed between the trap-rich layer and the supporting substrate 710. In some embodiments, the trap-rich layer is formed from amorphous silicon crystal or polycrystalline silicon crystal. In some embodiments, the buried oxide layer is either grown or deposited overlying the trap-rich layer. Other oxide materials could be used for the buried oxide layer.

Figure 7B:
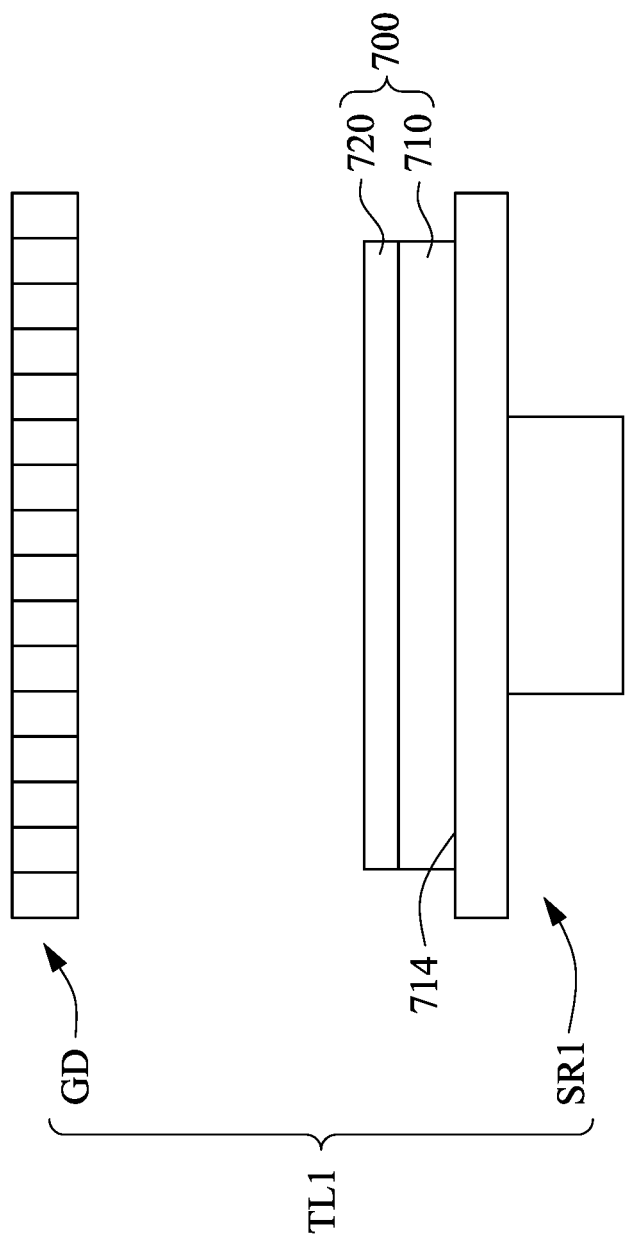

Then, the raw wafer 700 is placed on a first tool TL1 with the second surface 714 of the supporting substrate 710 contacting the first tool TL1, as shown in FIG. 7b, The first tool TL1 is configured to form a mask on the semiconductor substrate 720. In some embodiments, the first tool TL1 is a deposition tool including a supporter SR1 and a gas distributer GD, and the raw wafer 700 is placed on the supporter SR1 with the second surface 714 of the supporting substrate 710 contacting the supporter SR1.

Figure 7C:
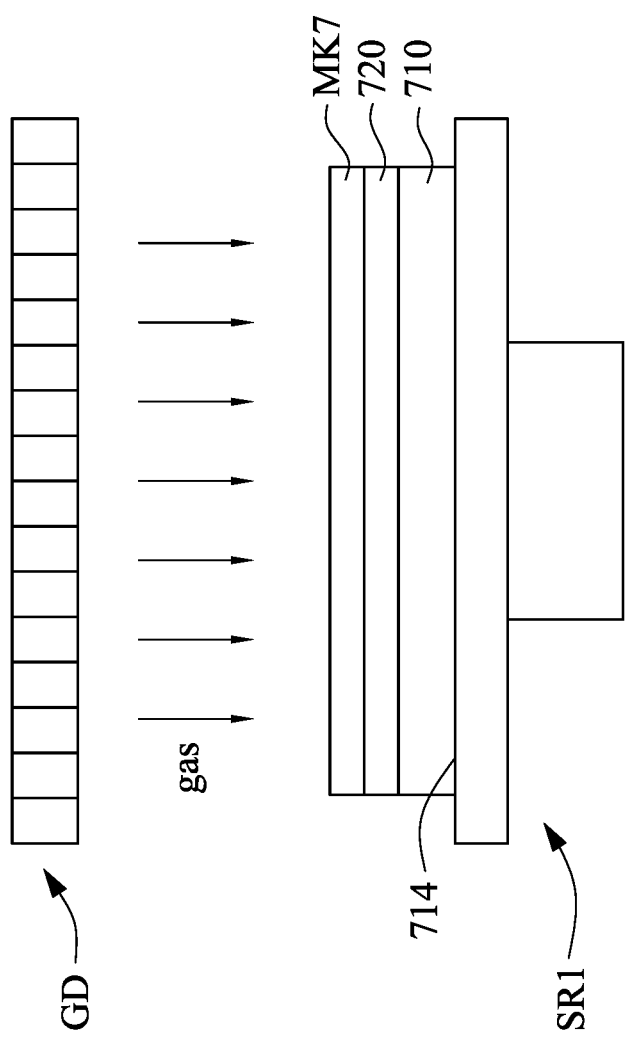

Thereafter, a mask MK7 is formed on the semiconductor substrate 720 by using the first tool TL1 while the second surface 714 of the supporting substrate 710 contacts the first tool TL1, as shown in FIG. 7c. In some embodiments, the gas distributor GD provides gas to the raw wafer 700 to deposit a material layer on the semiconductor substrate 720 as the mask MK7. In some embodiments, the mask MK7 covers a surface 721 of the semiconductor substrate 720, thereby protecting the surface 721 of the semiconductor substrate 720. In some embodiments, the mask layer MK7 is formed from silicon nitride, and a thickness of the mask layer MK7 is about 1200 angstroms, but embodiments of the present disclosure are not limited thereto. In some embodiments, the surface 721 of the semiconductor substrate 720 is cleaned, before the mask MK7 is formed. For example, a B clean operation and/or a scrub clean operation are conducted to clean the surface 721 of the semiconductor substrate 720. A chemical used in the B clean operation may include a solution of $NH_3/H_2O_2/H_2O$ (SC1), a solution of $HCl/H_2O_2/H_2O$ (SC2), diluted HF and a combination thereof.

Then, a contact layer is formed corresponding to the second surface 714 of the supporting substrate 710 by using a second tool, in which the contact layer is formed to have a resistivity smaller than or equal to about 3000 ohm-cm and greater than about 50 ohm-cm. In some embodiments, the contact layer is formed to have a resistivity smaller than about 3000 ohm-cm. In some embodiments, the second tool is an implantation tool configured to dope a portion of the supporting substrate 710 to form the contact layer. In some embodiments, the second tool is a deposition tool configured to depositing a material layer on the second surface 714 of the supporting substrate 710 to form the contact layer.

For example, as shown in FIG. 7d(1) to FIG. 7d(2), the second tool TL2 is an implantation tool configured to conduct an implantation operation for forming the contact layer 730. The implantation tool includes a supporter SR2 and an ion source IS. The supporter SR2 is configured to clamp the raw wafer 700 by using clampers CP, and the ion source IS provides ion beams to dope the portion 710d of the supporting substrate 710. When the implantation operation is conducted, the mask MK7 contacts the supporter SR2, and the second surface 714 of the supporting substrate 710 faces the ion source IS. In some embodiments, the portion 710d of the supporting substrate 710 is doped with a dopant including a group III element or a group V element at a concentration from about $1\times10^{12}$ atoms/cm$^2$ to about $1\times10^{18}$ atoms/cm$^2$. When the concentration of the dopant is lower than $1\times10^{12}$ atoms/cm$^2$, the backside of the supporting substrate may not have the expected resistivity smaller than or equal to about 3000 ohm-cm. When the concentration of the dopant is greater than about $1\times10^{18}$ atoms/cm$^2$, the backside of the supporting substrate cannot have the expected resistivity greater than about 50 ohm-cm. However, embodiments of the present disclosure are not limited thereto. In some embodiments, an annealing operation is conducted on the doped portion 710d of the supporting substrate 710, thereby reducing defects caused by above implantation operation. In some embodiments, a rapid thermal annealing (RTA) operation is used to anneal the doped portion 710d, but embodiments of the present disclosure are not limited thereto. In some embodiments, the annealing operation is conducted at a temperature from about 800° C. to about 1150° C. for a period of time from about 10 sec to about 120 sec. However, embodiments of the present disclosure are not limited thereto. When the annealing operation is operated under the above condition, dangling bonds of the contact layer 730 are recovered. Otherwise, the dangling bonds of the contact layer 330 are not recovered significantly.

For another example, as shown in FIG. 7e(1) to FIG. 7e(2), the second tool TL2 is a deposition tool configured to conduct a deposition operation for forming the contact layer 730. In some embodiments, the second tool TL2 is similar to the deposition tool TL1, but embodiments of the present disclosure are not limited thereto. When the deposition operation is conducted, the mask MK7 contacts the supporter SR2, and the second surface 714 of the supporting substrate 710 faces the gas distributor GD, thereby depositing a material layer on the second surface 714 as the contact layer 730. In some embodiments, the material layer has a resistivity smaller than the resistivity of the supporting substrate 710.

Figure 7F:
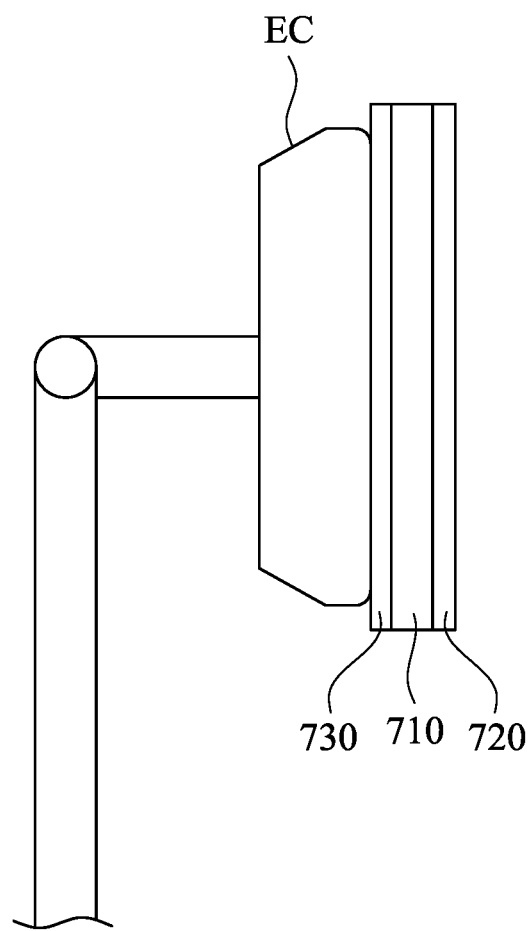

After the contact layer 730 is formed, the mask MK7 is removed to expose the surface 721 of the semiconductor substrate 720, and the raw wafer 700 is placed on the electrostatic chuck EC with the contact layer 730 contacting the electrostatic chuck EC, as shown in FIG. 7f. Because the contact layer 730 has the resistivity smaller than or equal to about 3000 ohm-cm and greater than about 50 ohm-cm, the raw wafer 700 is firmly secured on the electrostatic chuck EC when the contact layer 730 contacts the electrostatic chuck EC, thereby preventing the wafer 700 from being de-chucked from the electrostatic chuck EC unintentionally.

Figure 7G:
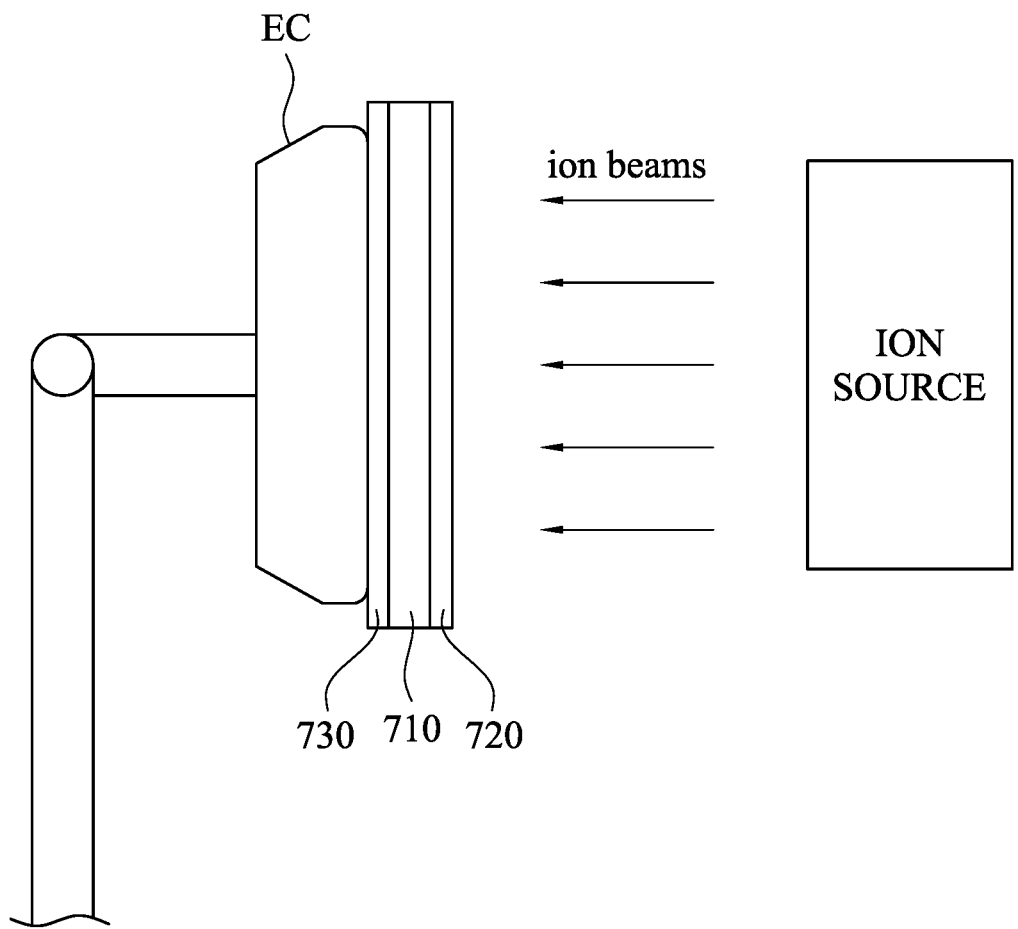
FIG. 7g is a schematic diagram showing an implantation operation for forming active regions of active devices in accordance with some embodiments of the present disclosure.

In some embodiments, plural operation for forming circuit devices are conducted after the raw wafer 700 is secured on the electrostatic chuck EC. For example, an implantation operation for forming active regions of active devices is conducted on the surface 721 of the semiconductor substrate 720, as shown in FIG. 7g. In some embodiments, the active devices are Metal Oxide Semiconductor Field Effect Transistors (MOSFETs), and the active regions are n-type wells or p-type wells. However, embodiments of the present disclosure are not limited thereto.

Figure 8:
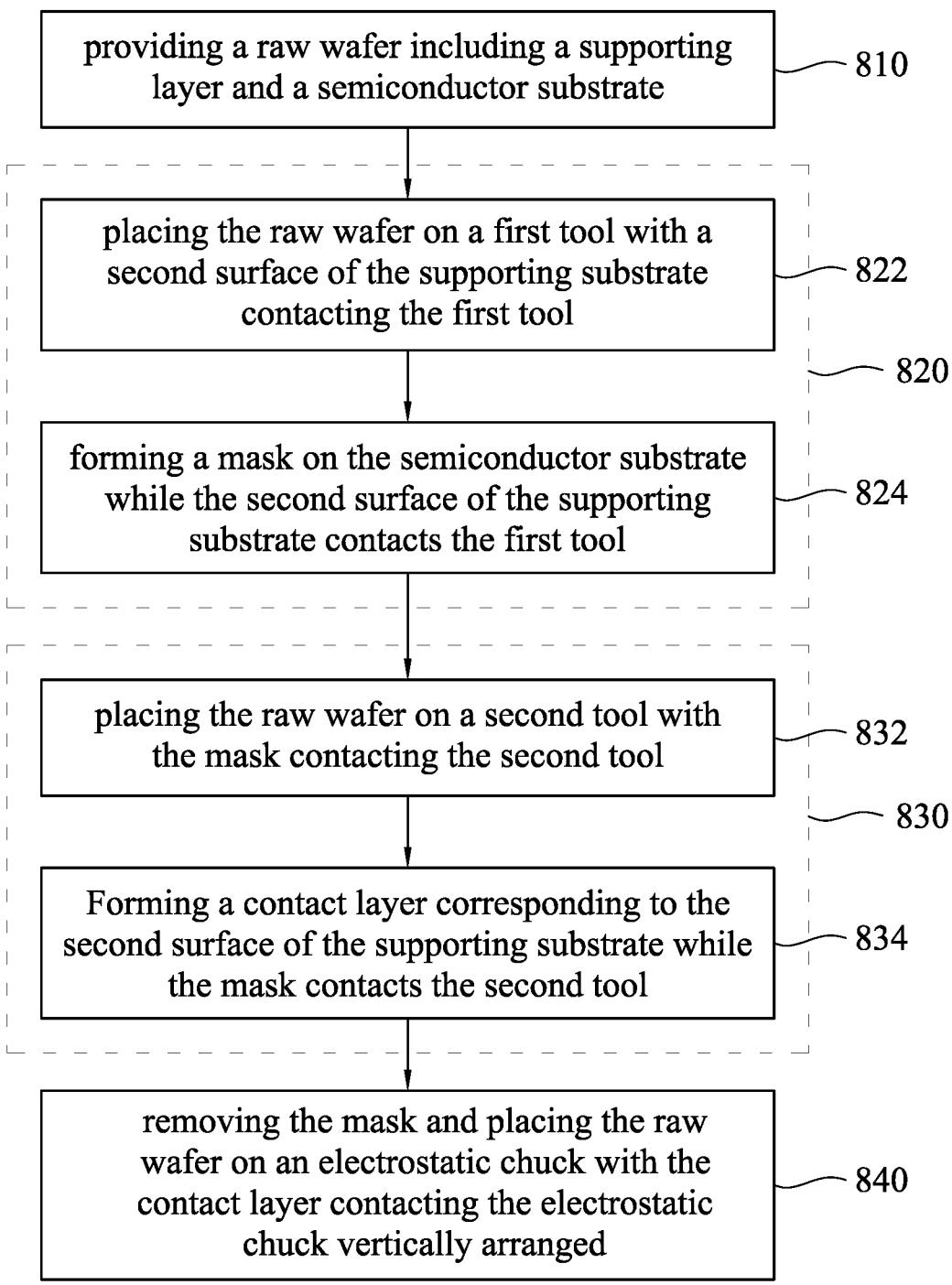
FIG. 8 is a flow chart showing a semiconductor wafer fabrication method in accordance with embodiments of the present disclosure.

Referring to FIG. 8, FIG. 8 is a flow chart showing a semiconductor wafer fabrication method 800 in accordance with embodiments of the present disclosure. At operation 810, the raw wafer 700 is provided, as shown in FIG. 7a. Then, at operation 820, a mask MK7 is formed on the semiconductor substrate 720 by using a first tool TL1, as shown in FIG. 7b and FIG. 7c. The operation 820 includes operation 822 and operation 824. At operation 822, the raw wafer 700 is placed on the first tool TL1 with the second surface 714 of the supporting substrate 710 contacting the first tool TL1, as shown in FIG. 7b. At operation 824, the mask MK7 is formed on the semiconductor substrate 720 while the second surface 714 of the supporting substrate 710 contacts the first tool TL1. Thereafter, at operation 830, the contact layer 730 is formed corresponding to the second surface 714 of the supporting substrate 710 by using the second tool TL2, as shown in FIG. 7d(1) to FIG. 7d(2) or FIG. 7e(1) to FIG. 7e(2). The operation 830 includes operation 832 and operation 834. At operation 832, the raw wafer is placed on the second tool TL2 with the mask MK7 contacting the second tool TL2, as shown in FIG. 7d(1) or FIG. 7e(1). At operation 834, the contact layer 730 is formed corresponding to the second surface 714 of the supporting substrate 710 while the mask MK7 contacts the second tool TL2, as shown in FIG. 7d(2) or FIG. 7e(2). Then, at operation 840, the mask MK7 is removed and the raw wafer 700 is placed on the electrostatic chuck EC with the contact layer 730 contacting the electrostatic chuck EC vertically arranged, as shown in FIG. 7f.

In accordance with an embodiment of the present disclosure, the present disclosure discloses a wafer. The wafer includes a supporting substrate, a semiconductor substrate and a contact layer. The supporting substrate has a first surface and a second surface opposite to the first surface. The semiconductor substrate is disposed on the first surface of the supporting substrate, in which the semiconductor substrate is configured to form plural devices. The contact layer is disposed on and contacting the second surface of the supporting substrate, in which the contact layer is configured to contact an electrostatic chuck, and a resistivity of the contact layer is smaller than a resistivity of the supporting substrate.

According to some embodiments, the resistivity of the contact layer is substantially smaller than or equal to substantially 3000 ohm-cm.

According to some embodiments, the resistivity of the contact layer is substantially greater than substantially 50 ohm-cm.

According to some embodiments, the contact layer comprises a dopant of a group III element or a group V element.

According to some embodiments, the contact layer and the supporting substrate are formed by different materials.

According to some embodiments, the raw wafer further includes a buried oxide layer and a trap-rich layer disposed between the supporting substrate and the semiconductor substrate, in which the buried oxide layer contacts the semiconductor substrate and the trap-rich layer, and the trap-rich layer contacts the buried oxide layer and the supporting substrate.

According to some embodiments, the semiconductor substrate is a silicon layer configured to form circuit devices.

In accordance with another embodiment of the present disclosure, in the wafer fabrication method, at first, a raw wafer is provided. The raw wafer includes a supporting substrate and a semiconductor substrate. The supporting substrate has a first surface and a second surface opposite to the first surface. The semiconductor substrate is formed on the first surface of the supporting substrate, wherein the semiconductor substrate is configured to form plural devices. After the raw wafer is provided, a contact layer is formed corresponding to the second surface of the supporting substrate, in which the contact layer is configured to contact an electrostatic chuck, and a resistivity of the contact layer is smaller than a resistivity of the supporting substrate.

According to some embodiments, the operation for forming the contact layer includes performing an implantation operation on the second surface of the supporting substrate to transform a portion of the supporting substrate to a contact layer, thereby modifying the raw wafer as a modified wafer.

According to some embodiments, the semiconductor wafer fabricating method further includes annealing the second surface of the supporting substrate of the raw wafer after performing the implantation operation on the second surface of the supporting substrate.

According to some embodiments, the operation for forming the contact layer includes performing a deposition process on the second surface of the supporting substrate to transform a portion of the supporting substrate to a contact layer, thereby modifying the raw wafer as a modified wafer.

According to some embodiments, the semiconductor wafer fabricating method further includes forming a mask on the semiconductor substrate of the raw wafer, before forming the contact layer.

According to some embodiments, the resistivity of the contact layer is substantially smaller than or equal to substantially 3000 ohm-cm.

According to some embodiments, the resistivity of the contact layer is substantially greater than substantially 50 ohm-cm.

In accordance with another embodiment of the present disclosure, in the method for fabricating a wafer, at first a raw wafer is provided. The raw wafer includes a supporting substrate and a semiconductor substrate. The supporting substrate has a first surface and a second surface opposite to the first surface. The semiconductor substrate is formed on the first surface of the supporting substrate, wherein the semiconductor substrate is configured to form plural devices. After the raw wafer is provided, a mask is formed on the semiconductor substrate by using a first tool. The operation for forming the mask includes placing the raw wafer on the first tool with the second surface of the supporting substrate contacting the first tool, and forming the mask on the semiconductor substrate while the second surface of the supporting substrate contacts the first tool. Then, a contact layer is formed corresponding to the second surface of the supporting substrate by using a second tool. The operation for forming the contact layer includes placing the raw wafer on the second tool with the mask contacting the second tool, and forming the contact layer corresponding to the second surface of the supporting substrate while the mask contacts the second tool. Thereafter, the mask is removed and the raw wafer is placed on the electrostatic chuck with the contact layer contacting the electrostatic chuck vertically arranged.

According to some embodiments, the operation for forming the contact layer includes performing an implantation operation on the second surface of the supporting substrate to transform a portion of the supporting substrate to a contact layer.

According to some embodiments, the semiconductor wafer fabricating method further includes annealing the second surface of the supporting substrate of the raw wafer after performing the implantation operation on the second surface of the supporting substrate.

According to some embodiments, the operation for forming the contact layer includes performing a deposition process on the second surface of the supporting substrate to transform a portion of the supporting substrate to a contact layer.

According to some embodiments, the resistivity of the contact layer is substantially smaller than or equal to substantially 3000 ohm-cm.

According to some embodiments, the resistivity of the contact layer is substantially greater than substantially 50 ohm-cm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor wafer fabricating method, comprising:
    providing a raw wafer, wherein the raw wafer comprises:
        a supporting substrate having a first surface and a second surface opposite to the first surface of the supporting substrate; and
        a semiconductor substrate formed on the first surface of the supporting substrate, wherein the semiconductor substrate is configured to form a plurality of devices;
    forming a contact layer corresponding to the second surface of the supporting substrate, wherein the contact layer is configured to contact an electrostatic chuck, and a resistivity of the contact layer is smaller than a resistivity of the supporting substrate; and
    forming a mask on the semiconductor substrate of the raw wafer before forming the contact layer.

2. The semiconductor wafer fabricating method of claim 1, wherein forming the contact layer comprises: performing an implantation operation on the second surface of the supporting substrate to transform a portion of the supporting substrate to the contact layer, thereby modifying the raw wafer as a modified wafer.

3. The semiconductor wafer fabricating method of claim 2, further comprising:
    annealing the second surface of the supporting substrate of the raw wafer after performing the implantation operation on the second surface of the supporting substrate.

4. The semiconductor wafer fabricating method of claim 1, wherein forming the contact layer comprises: performing a deposition process on the second surface of the supporting substrate to form the contact layer on the second surface of the supporting substrate.

5. The semiconductor wafer fabricating method of claim 1, wherein the resistivity of the contact layer is substantially smaller than or equal to substantially 3000 ohm-cm.

6. The semiconductor wafer fabricating method of claim 1, wherein the resistivity of the contact layer is substantially greater than substantially 50 ohm-cm.

7. The semiconductor wafer fabricating method of claim 1, wherein the contact layer and the supporting substrate are formed by different materials.

8. A semiconductor wafer fabricating method, comprising:
    providing a raw wafer, wherein the raw wafer comprises:
        a supporting substrate having a first surface and a second surface opposite to the first surface; and
        a semiconductor substrate formed on the first surface of the supporting substrate, wherein the semiconductor substrate is configured to form a plurality of devices; and
    forming a mask on the semiconductor substrate by using a first tool, comprising:
        placing the raw wafer on the first tool with the second surface of the supporting substrate contacting the first tool; and forming the mask on the semiconductor substrate while the second surface of the supporting substrate contacts the first tool;

forming a contact layer corresponding to the second surface of the supporting substrate by using a second tool, comprising:

placing the raw wafer on the second tool with the mask contacting the second tool; and forming the contact layer corresponding to the second surface of the supporting substrate while the mask contacts the second tool; and removing the mask and placing the raw wafer on an electrostatic chuck with the contact layer contacting the electrostatic chuck vertically arranged.

9. The semiconductor wafer fabricating method of claim 8, wherein forming the contact layer comprises: performing an implantation operation on the second surface of the supporting substrate to transform a portion of the supporting substrate to the contact layer.

10. The semiconductor wafer fabricating method of claim 9, further comprising:

annealing the second surface of the supporting substrate of the raw wafer after performing the implantation operation on the second surface of the supporting substrate.

11. The semiconductor wafer fabricating method of claim 8, wherein forming the contact layer comprises: performing a deposition process on the second surface of the supporting substrate to form the contact layer on the second surface of the supporting substrate.

12. The semiconductor wafer fabricating method of claim 8, wherein an resistivity of the contact layer is substantially smaller than or equal to substantially 3000 ohm-cm.

13. The semiconductor wafer fabricating method of claim 8, wherein an resistivity of the contact layer is substantially greater than substantially 50 ohm-cm.

14. A semiconductor wafer fabricating method, comprising:

providing a wafer, comprising:

providing a raw wafer comprising a supporting substrate having a first surface and a second surface opposite to the first surface and a semiconductor substrate disposed on the first surface of the supporting substrate; and performing an implantation operation on the supporting substrate of the raw wafer to form a contact layer disposed on and contacting the second surface of the supporting substrate, wherein a resistivity of the contact layer is smaller than a resistivity of the supporting substrate;

securing the wafer on an electrostatic chuck, wherein the contact layer contacts the electrostatic chuck; and forming a plurality of devices on the semiconductor substrate.

15. The semiconductor wafer fabricating method of claim 14, wherein the resistivity of the contact layer is substantially smaller than or equal to substantially 3000 ohm-cm.

16. The semiconductor wafer fabricating method of claim 15, wherein the resistivity of the contact layer is substantially greater than substantially 50 ohm-cm.

17. The semiconductor wafer fabricating method of claim 14, wherein the contact layer comprises a dopant of a group III element or a group V element.

18. The semiconductor wafer fabricating method of claim 14, wherein the contact layer and the supporting substrate are formed by different materials.

19. The semiconductor wafer fabricating method of claim 14, further comprising:

annealing the supporting substrate of the raw wafer after performing the implantation operation on the supporting substrate.

20. The semiconductor wafer fabricating method of claim 14, further comprising:

forming a mask on the semiconductor substrate of the raw wafer before performing the implantation operation on the supporting substrate.

* * * * *